United States Patent
Shen et al.

(10) Patent No.: US 8,065,587 B2
(45) Date of Patent: Nov. 22, 2011

(54) REDUCED COMPLEXITY ARP (ALMOST REGULAR PERMUTATION) INTERLEAVES PROVIDING FLEXIBLE GRANULARITY AND PARALLELISM ADAPTABLE TO ANY POSSIBLE TURBO CODE BLOCK SIZE

(75) Inventors: Ba-Zhong Shen, Irvine, CA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1189 days.

(21) Appl. No.: 11/811,013

(22) Filed: Jun. 7, 2007

(65) Prior Publication Data

US 2008/0086674 A1 Apr. 10, 2008

Related U.S. Application Data

(60) Provisional application No. 60/850,492, filed on Oct. 10, 2006, provisional application No. 60/861,832, filed on Nov. 29, 2006, provisional application No. 60/872,367, filed on Dec. 1, 2006, provisional application No. 60/872,716, filed on Dec. 4, 2006, provisional application No. 60/879,301, filed on Jan. 8, 2007.

(51) Int. Cl.
*H03M 13/00* (2006.01)
(52) U.S. Cl. .................. 714/755; 714/786; 714/762
(58) Field of Classification Search ............ 714/755, 714/786, 788, 762
See application file for complete search history.

(56) References Cited

U.S. PATENT DOCUMENTS

| | | | |
|---|---|---|---|
| 5,406,570 | A | 4/1995 | Berrou et al. |
| 5,446,747 | A | 8/1995 | Berrou |
| 5,563,897 | A | 10/1996 | Pyndiah et al. |
| 6,065,147 | A | 5/2000 | Pyndiah et al. |
| 6,119,264 | A | 9/2000 | Berrou et al. |
| 6,122,763 | A | 9/2000 | Pyndiah et al. |
| 6,392,572 | B1 | 5/2002 | Shiu et al. |

FOREIGN PATENT DOCUMENTS

| | | |
|---|---|---|
| EP | 0 735 696 A2 | 10/1996 |
| EP | 0 735 696 A3 | 1/1999 |
| FR | 91 05278 A1 | 10/1992 |
| KR | 10-2004-0034607 | 4/2004 |
| WO | 02/093755 A1 | 11/2002 |

OTHER PUBLICATIONS

Berrou et al. "Designing good permutations for turbo codes: towards a single model;" IEEE; Jun. 2004.*
Motorola, "A contention-free interleaver design for L TE codes," 3GPP TSG RAN WG1#47 (8 pages).

(Continued)

*Primary Examiner* — Guy Lamarre
(74) *Attorney, Agent, or Firm* — Garlick Harrison & Markison; Shayne X. Short

(57) ABSTRACT

Reduced complexity ARP (almost regular permutation) interleaves providing flexible granularity and parallelism adaptable to any possible turbo code block size. A novel means is presented by which any desired turbo code block size can be employed when only requiring, in only some instances, a very small number of dummy bits. This approach also is directly adaptable to parallel turbo decoding, in which any desired degree of parallelism can be employed. Alternatively, as few as one turbo decoder can be employed in a fully non-parallel implementation as well. Also, this approach allows for storage of a reduced number of parameters to accommodate a wide variety of interleaves.

20 Claims, 11 Drawing Sheets

OTHER PUBLICATIONS

Blankenship, T. Keith, et al., "High-Throughput Turbo Decoding techniques for 4G", in Proc. Int. Conf. 3G Wireless and Beyond, San Francisco, CA, May 2002, pp. 137-142.

Libero Dinoi, Alberto Tarable, Sergio Benedetto, "A permutation decomposition based algorithm for the design of prunable interleavers for parallel turbo decoder architectures," Communications, 2006. ICC apos;06. IEEE International Conference on, vol. 3, Issue , Jun. 2006 pp. 1148-1153, Digital Object Identifier 10.1109/ ICC.2006.254902.

C. Berrou, Y. Saouter, C. Douillard, S. Kerouédan, and M. Jézéquel, "Designing good permutations for turbo codes: towards a single model," 2004 IEEE International Conference on Communications (ICC), vol. 1, pp. 341-345, Jun. 20-24, 2004.

3GPP TS 25.212 V6.8.0 (Jun. 2006), 3rd Generation Partnership Project; Technical Specification Group Radio Access Network; Multiplexing and channel coding (FDD) (Release 6) (84 pages).

Proposed way forward on turbo interleaver (tc_info_sizes_test_mot_nov14.txt), 3GPP TSG RAN WG1 #47 R1-063564 (1 page).

France Telecom, GET, "Enhancement of Rel. 6 Turbo Code," 3GPP TSG RAN WG1#43, Seoul, Korea, Nov. 7-11, 2005, R1-051310, 6 pages.

A. Nimbalker, T. E. Fuja, D. J. Costello, Jr., T. K. Blankenship, and B. Classon, "Contention-Free Interleavers," IEEE ISIT 2004, Chicago, USA, Jun. 27-Jul. 2, 2004, p. 52.

C. Berrou, Y. Saouter, C. Douillard, S. Kerouédan, and M. Jézéquel, "Designing good permutations for turbo codes: towards a single model," 2004 IEEE International Conference on Communications (ICC), vol. 1, pp. 341-345, Jun. 20-24, 2004.

Bruno Bougard, Alexandre Giulietti, Liesbet Van der Perre, F. Catthoor, "A Class of Power Efficient VLSI Architectures for High Speed Turbo-Decoding," Globecom '02. 2002—IEEE Global Telecommunications Conference, Conference Proceedings. Taipei, Taiwan, Nov. 17-21, 2002; [IEEE Global Telecommunications Conference], New York, NY : IEEE, US, vol. 1, Nov. 17, 2002, pp. 549-553, XP010636011 ISBN: 978-0-7803-7632-8.

Bruno Bougard, Alexandre Giulietti, et al., "A Scalable 8.7nJbit 75.6Mb/s Parallel Concatenated Convolutional (Turbo-) CODEC," 2003 IEEE International Solid-State Circuits Conference, 2003, Digest of Technical Papers. ISS CC. 2003, IEEE International San Francisco, CA, USA, Feb. 9-13, 2003, Piscataway, NJ, USA,IEEE, US, Feb. 9, 2003, pp. 1-10, XP010661601, ISBN: 978-0-7803-7707-3.

Alberto Tarable, S. Benedetto, "Mapping Interleaving Laws to Parallel Turbo Decoder Architectures," IEEE Communications Letters, vol. 8, No. 3, Mar. 2004, pp. 162-164.

Libero Dinoi, Sergio Benedetto, "Variable-size interleaver design for parallel turbo decoder architectures," IEEE Communications Society Globecom 2004, Globecom '04. IEEE Dallas. TX. USA, Nov. 29-Dec. 3, 2004, pp. 3108-3112.

Michael J. Thul, Norbert Wehn, "FPGA Implementation of Parallel Turbo-Decoders," SBCCI '04, Sep. 7-11, 2004, Pernambuco, Brazil, pp. 198-203.

Zhiyong He, Sebastien Roy, and Paul Fortier, "High-Speed and Low-Power Design of Parallel Turbo Decoder," Circuits and Systems, 2005, ISCAS 2005, IEEE International Symposium 0n Kobe, Japan May 23-26, 2005, pp. 6018-6021.

Xiang He, Han Wen Luo, HaiBin Zhang, "A Novel Storage Scheme for Parallel Turbo Decoder," Vehicular Technology Conference, 2005, VTC-2005-Fall, 2005 IEEE 62nd Dallas, TX, USA Sep. 25-28, 2005, Piscataway, NJ, USA, IEEE, vol. 3, Sep. 25, 2005, pp. 1950-1954.

Alberto Tarable, Sergio Benedetto, and Guido Montrosi, "Mapping Interleaving Laws to Parallel Turbo and LDPC Decoder Architectures," IEEE Trans. Information Theory, vol. 50, No. 9, Sep. 2004, pp. 2002-2009.

Jun Ma, Ali Saidi, "High-Speed Parallel Turbo Decoding for Max-Logmap Kernel Operation Algorithm," IP.COM Journal, IP.COM Inc., West Henrietta, NY, US, Mar. 2, 2001, XP013000274, ISSN: 1533-0001, 4 pages.

Libero Dinoi, Alberto Tarable, Sergio Benedetto, "A permutation decomposition based algorithm for the design of prunable interleavers for parallel turbo decoder architectures," Communications, 2006, ICC '06, IEEE International Conference on, IEEE, PI, Jun. 1, 2006, pp. 1148-1153.

Ke Wan, Qingchen Chen, Pingzhi Fan, "A Novel Parallel Turbo Coding Technique Based on Frame Split and Trellis Terminating," Parallel AN0 Distributed Computing, Applications and Technologies, 200 3. PDCAT '2003, Proceedings of the Fourth International Conference on Aug. 27-29, 2003, Piscataway, NJ, USA, IEEE, Aug. 27, 2003, pp. 927-930.

A. Giulietti, L. van der Perre, and M. Strum, "Parallel turbo coding interleavers: avoiding collisions in accesses to storage elements," Electronics Letters, Feb. 28, 2002, vol. 38 No. 5, pp. 232-234.

* cited by examiner

REDUCED COMPLEXITY ARP (ALMOST REGULAR PERMUTATION) INTERLEAVES PROVIDING FLEXIBLE GRANULARITY AND PARALLELISM ADAPTABLE TO ANY POSSIBLE TURBO CODE BLOCK SIZE

CROSS REFERENCE TO RELATED PATENTS/PATENT APPLICATIONS

Provisional Priority Claims

The present U.S. Patent Application claims priority pursuant to 35 U.S.C. §119(e) to the following U.S. Provisional Patent Applications which are hereby incorporated herein by reference in their entirety and made part of the present U.S. Patent Application for all purposes:

1. U.S. Provisional Application Ser. No. 60/850,492, entitled "General and algebraic-constructed contention-free memory mapping for parallel turbo decoding with algebraic interleave ARP (almost regular permutation) of all possible sizes," filed Oct. 10, 2006.

2. U.S. Provisional Application Ser. No. 60/872,367, entitled "Turbo decoder employing ARP (almost regular permutation) interleave and inverse thereof as de-interleave," filed Dec. 1, 2006.

3. U.S. Provisional Application Ser. No. 60/872,716, entitled "Turbo decoder employing ARP (almost regular permutation) interleave and arbitrary number of decoding processors," filed Dec. 4, 2006.

4. U.S. Provisional Application Ser. No. 60/861,832, entitled "Reduced complexity ARP (almost regular permutation) interleaves providing flexible granularity and parallelism adaptable to any possible turbo code block size," filed Nov. 29, 2006.

5. U.S. Provisional Application Ser. No. 60/879,301, entitled "Address generation for contention-free memory mappings of turbo codes with ARP (almost regular permutation) interleaves," filed Jan. 8, 2007.

Incorporation by Reference

The following U.S. Patent Applications are hereby incorporated herein by reference in their entirety and made part of the present U.S. Patent Application for all purposes:

1. U.S. application Ser. No. 11/704,068, entitled "General and algebraic-constructed contention-free memory mapping for parallel turbo decoding with algebraic interleave ARP (almost regular permutation) of all possible sizes," filed Feb. 8, 2007, pending.

2. U.S. application Ser. No. 11/657,819, entitled "Turbo decoder employing ARP (almost regular permutation) interleave and inverse thereof as de-interleave," filed Jan. 25, 2007, pending.

3. U.S. application Ser. No. 11/811,014, entitled "Turbo decoder employing ARP (almost regular permutation) interleave and arbitrary number of decoding processors," filed concurrently on Jun. 7, 2007, now issued as U.S. Pat. No. 7,827,473 B2 on Nov. 2, 2010.

4. U.S. application Ser. No. 11/810,989, entitled "Address generation for contention-free memory mappings of turbo codes with ARP (almost regular permutation) interleaves," filed concurrently on Jun. 7, 2007, now issued as U.S. Pat. No. 7,831,894 B2 on Nov. 9, 2010.

BACKGROUND OF THE INVENTION

1. Technical Field of the Invention

The invention relates generally to communication systems; and, more particularly, it relates to communication systems employing turbo coding.

2. Description of Related Art

Data communication systems have been under continual development for many years. One such type of communication system that has been of significant interest lately is a communication system that employs iterative error correction codes. One type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

The use of turbo codes providing such relatively lower error rates, while operating at relatively low data throughput rates, has largely been in the context of communication systems having a large degree of noise within the communication channel and where substantially error free communication is held at the highest premium. Some of the earliest application arenas for turbo coding were space related where accurate (i.e., ideally error free) communication is often deemed an essential design criterion. The direction of development then moved towards developing terrestrial-applicable and consumer-related applications. Still, based on the heritage of space related application, the focus of effort in the turbo coding environment then continued to be achieving relatively lower error floors, and not specifically towards reaching higher throughput.

More recently, focus in the art has been towards developing turbo coding, and variants thereof, that are operable to support higher amounts of throughput while still preserving the relatively low error floors offered within the turbo code context.

In fact, as the throughput requirement in communication systems increases, parallel turbo decoding, which employs a plurality of processors and a plurality of memory banks, become necessary. Many of the current systems support a wide range of codeword sizes. Thus, efficiency and flexibility in parallel turbo decoder design is of critical importance.

Generally speaking, within the context of communication systems that employ turbo codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the

DETAILED DESCRIPTION OF THE INVENTION

Many communication systems incorporate the use of a turbo code. When performing decoding of turbo coded signals, there are a variety of means to do so. One means of decoding turbo coded signals is to perform parallel decoding such that a number of turbo decoders are arranged in parallel. In addition, such a parallel decoding approach often involves a number of memories that are also arranged in parallel.

However, there is a challenge to ensure that there are no read and write conflicts between the various turbo decoders and the various memories when performing this parallel decoding approach. When the conflicts during memory access are avoided, then that operation is referred to as contention-free.

While there are many potential applications that can employ turbo codes, means are presented herein that can be applied to the 3GPP channel code to support an arbitrary number of information bits. Some examples of the number of bits that can be supported using the various aspects of the invention presented herein are 40 to 5114 for WCDMA and HSDPA and more for LTE.

Additional information regarding the UTRA-UTRAN Long Term Evolution (LTE) and 3GPP System Architecture Evolution (SAE) can be found at the following Internet web site:

www.3gpp.org

Within the channel coding system in 3GPP LTE, there is a need and desire to supply and provide for a wide range of block sizes (i.e., turbo code block lengths). Furthermore, turbo decoding of this system generally needs to be implemented using a parallel decoding arrangement because of the very high data throughput and large block size desired. The parallel decoding requires the contention-free memory accessing (i.e., any one turbo decoder (of a group of parallel arranged turbo decoders) accesses only memory (of a group of parallel arranged memories) at any given time). Turbo coding was suggested for 3GPP LTE channel coding. For this coding system, the algebraic interleave referred to as the "almost regular permutation (ARP)" in reference [1] is considered as one of the candidates.

Within the context of channel coding systems in 3GPP LTE, the 3GPP Rel.6 employs turbo code interleaves that need 500 different interleaves. In addition, the prior art approach to comporting with Rel.6 has generally been to dedicate hardware to implement all of these different interleaves. This has proven to be very space consuming and cost inefficient. Moreover, in order to carry on parallel turbo decoding, the prior art approaches generally employ many dummy bits that are necessarily required when using the above mentioned interleaves according to the prior art approaches. By employing so many different interleaves in these approaches, there is necessarily a requirement for more hardware and memory.

Figure 1:
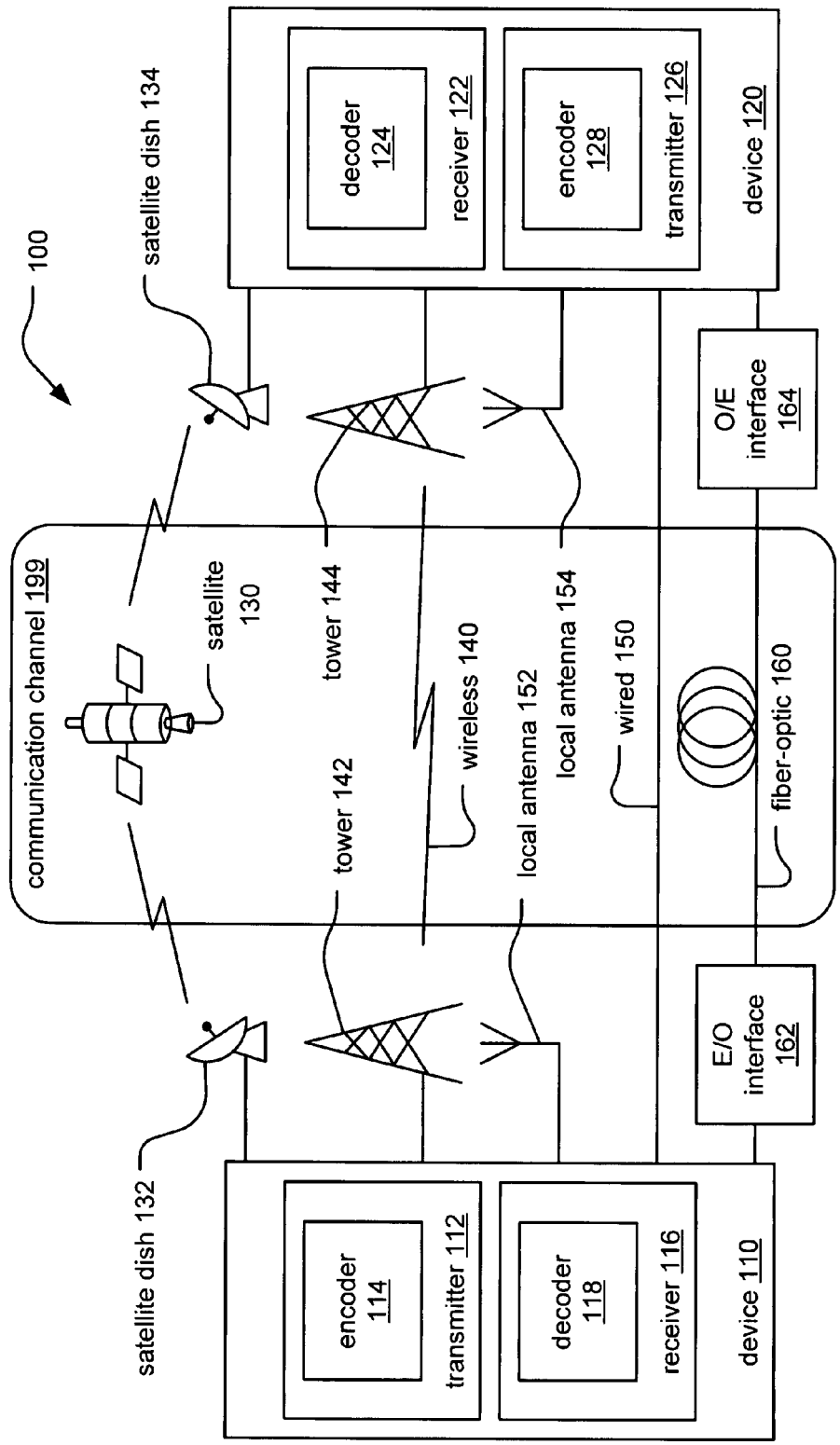
FIG. 1 illustrates an embodiment of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

A novel approach is presented herein by which significantly reduced complexity ARP (almost regular permutation) interleaves are employed. In some embodiments, as few as 4 different interleaves can be employed while still accommodating all possible block sizes of turbo codes. Some of these benefits of this novel approach include significant reduction in hardware and complexity that is provided by employing a straightforward multiplication/scaling (i.e., with respect to the variable number P in normal ARP interleaves) becomes, and the storage of the interleave parameters is inherently very small. For example, instead of about 108 parameters required to be stored for Rel.6 interleaves as cited in reference, [2], only 52 parameters are required using the novel approach presented herein. Moreover, the approach presented herein is much easier to implement, in that, a closed formula solution is provided for the interleaves, and this is much easier to implement than the approach presented by the Rel.6 interleaves.

In addition, this novel approach provides for flexible granularity with respect to the information block size that can be generated. The novel interleaves presented herein are suitable for all possible block size, and in only some instances is there any need at all to add a very small number of dummy bits. Many instances require no dummy bits at all. This is especially useful for parallel decoding since the pruning technique suggested in Rel.6 is not suitable for parallel decoding.

Figure 8:
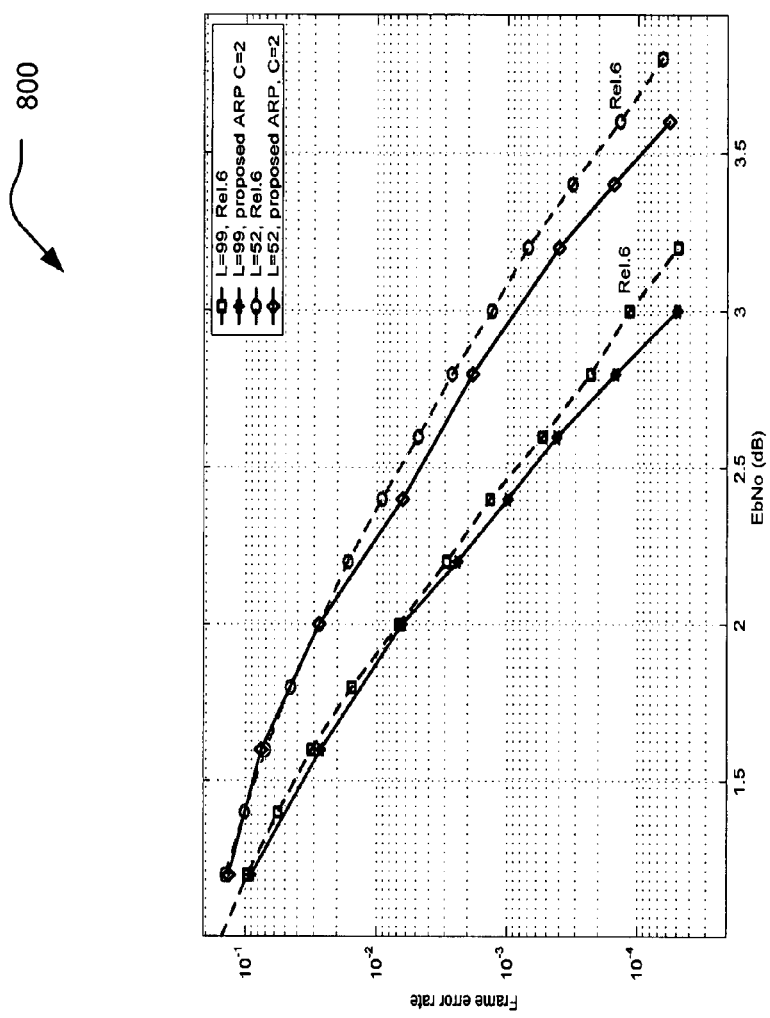
FIG. 8, FIG. 9, FIG. 10, and FIG. 11 illustrate performance diagrams of 7 different block sized turbo codes as simulated with Rel.6 interleaves and the novel ARP interleaves provided herein.
Figure 9:
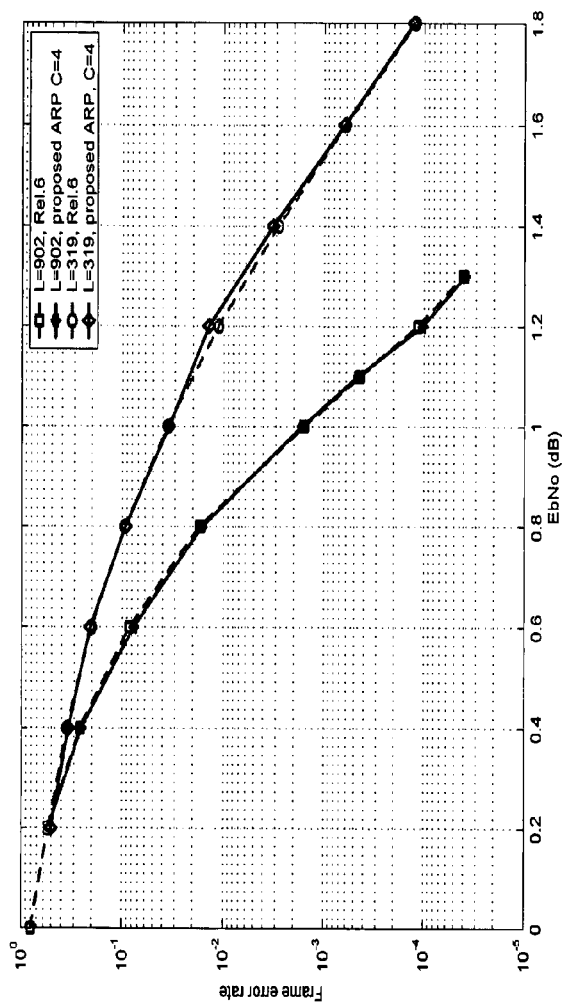
Figure 10:
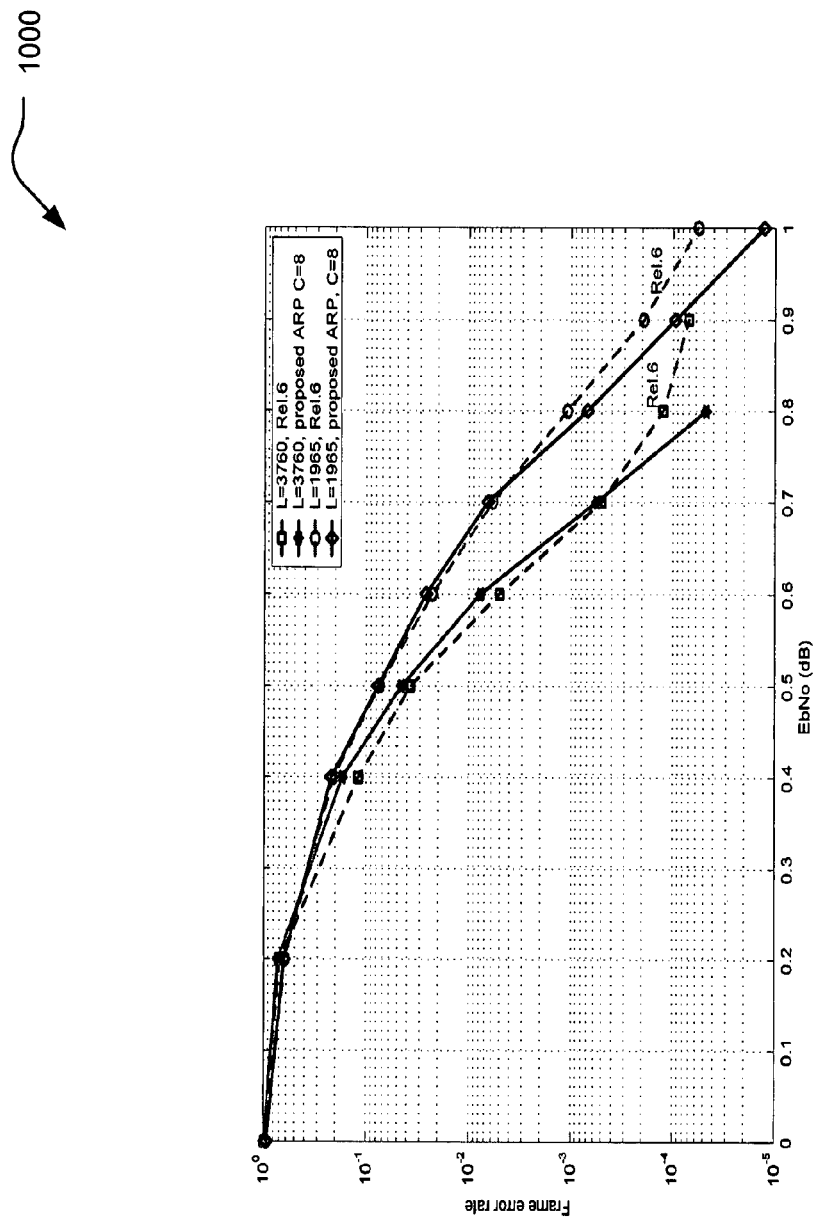

The performance of the interleaves presented herein are also better than or almost equal to those of Rel.6 interleaves (i.e., see at least FIGS. 8, 9, and 10 for some comparisons).

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Many of the embodiments presented herein employ various embodiments of the ARP (almost regular permutation) interleaves. An ARP (almost regular permutation) of information block size L=CW (i.e. C is a divider of L) introduced in reference [1] is defined by $$i=\pi(j)=jP+\theta+A(j \bmod C)P+B(j \bmod C) \bmod L$$

where P is relative prime to L, θ is a constant and A(x) and B(x) are integer function defined on {0,1,...,C−1}. To insure the function defined the function is a permutation (i.e. one to one and on to), in [1] A(x) and B(x) are further restricted to $$A(i)P+B(i)=C[\alpha(i)P+\beta(i)], i=0,\ldots,C-1$$

where α and β are integer functions. In this document, we call C the dithering cycle of the ARP.

Some problems with respect to parallel decoding of turbo codes is generated by the prior art approaches to perform the interleaving for the Rel. 6. In order to carry on degree m parallel decoding, a contention-free memory map, which maps the values output from the m parallel processors to the different memory banks, is needed. On the other hand, 3GPP LTE turbo coding has to support any block size from 40 up to 8192 or more. With the number of interleaves (about 500 interleaves in 3GPP TS 25.212 (V6.8.0, called Rel.6) [2]), the pruning technique is introduced which involves adding what is typically a significant number of dummy bits to the information block when the information block does not correspond to a given interleave size; these dummy bits are then pruned away from the output of the interleaved data block. However, this pruning technique causes problems on the contention-free map since the map is defined on the original (i.e., pre-pruned) interleave size. Therefore, pruning technique may be too difficult to implement efficiently. That means the dummy bits have to be sent to and launching into the communication channel. However, if the interleave is not chosen carefully, then the adding of dummy bits may cause a significant rate loss. For example, using Rel.6 interleave for a block size 2304 (listed in the simulation blocks for [3]) 216 (i.e., 9.3% of the total information block size) dummy bits need to be added.

Figure 2:
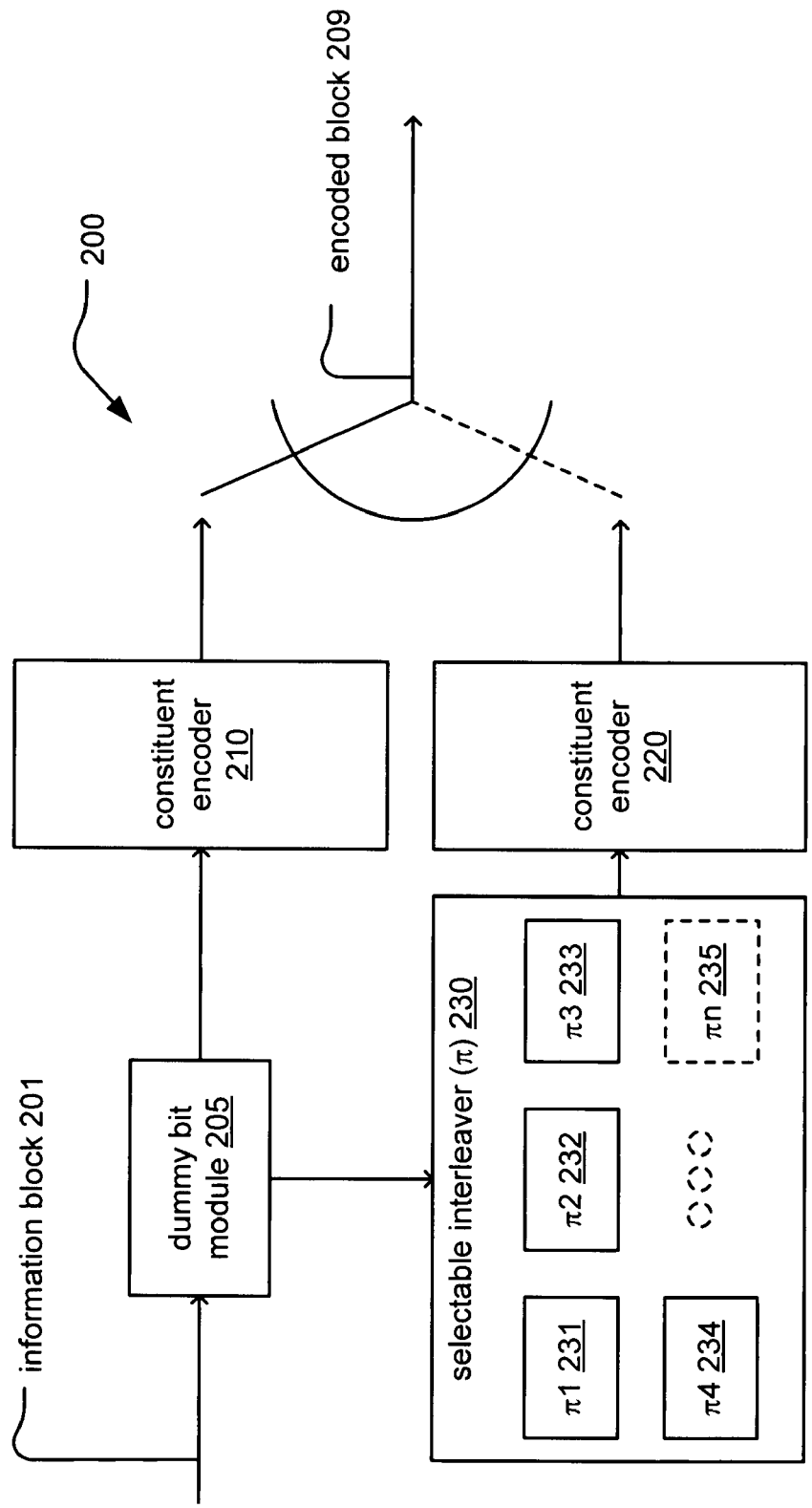
FIG. 2 illustrates an embodiment of a turbo encoder employing selectable interleaving.

FIG. 2 illustrates an embodiment of a turbo encoder 200 employing selectable interleaving. An information block 201, which includes at least one information bit, is provided to a dummy bit module 205. The dummy bit module 205 is operable to add a small number of dummy bits to the information block 201 based on a size of the information block 201. There are many embodiments that require no adding of any dummy bits whatsoever to the information block 201. The information block 201, which is then output from the dummy bit module 205 after any dummy bits have been selectively added thereto, is simultaneously provided to a top path and a bottom path. The top path includes a first constituent encoder 210, and the bottom path includes a selectable interleaver (π) 230 communicatively coupled to a second constituent encoder 220. A variety of interleaves may be performed as selected for the particular application within the selectable interleaver (π) 230. The selectable interleaver (π) 230 can include any number of interleaves, as shown by a first interleave (π1) 231, a second interleave (π2) 232, a third interleave (π3) 233, a fourth interleave (π4) 234, and up to an nth interleave (πn) 239. The outputs from the top and bottom paths are alternatively selected to form an encoded block 299.

It is noted that the number of interleaves within the selectable interleaver (π) 230 can be any desired number, and in some embodiments, the number of interleaves within the selectable interleaver (π) 230 includes 10 or fewer interleaves. The turbo encoder 200 is operable to encode any information block whose size is within a predetermined range (e.g., between block size "a" and block size "b", where "a" and "b" are integer values and upper and lower bounds of the predetermined range, respectively. The predetermined range is divided into a plurality of regions such that each region of the plurality of regions (e.g., k regions) corresponds to one interleave of the plurality of interleaves. In other words, a first region employs a first interleave of the plurality of interleaves; a second region employs a second interleave of the plurality of interleaves. There is a one-to-one correspondence between each region and only one corresponding interleave of the plurality of interleaves.

Figure 3:
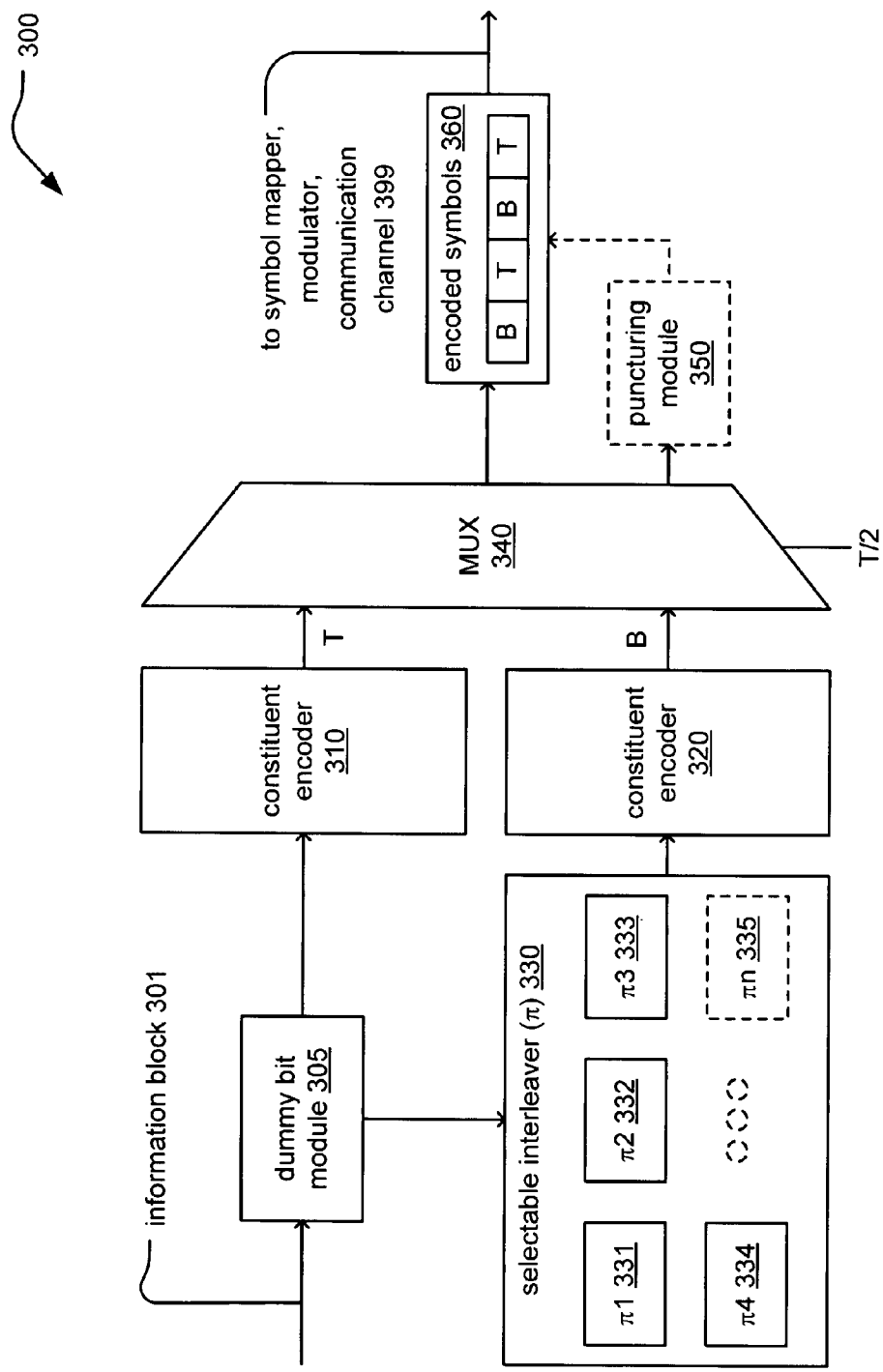
FIG. 3 illustrates another embodiment of a turbo encoder employing selectable interleaving.

FIG. 3 illustrates another embodiment of a turbo encoder 300 employing selectable interleaving. This embodiment is somewhat analogous to the previous embodiment. An information block 301, which includes at least one information bit, is provided to a dummy bit module 305. The dummy bit module 305 is operable to add a small number of dummy bits to the information block 301 based on a size of the information block 301. There are many embodiments that require no adding of any dummy bits whatsoever to the information block 301. The information block 301, which is then output from the dummy bit module 305 after any dummy bits have been selectively added thereto, is simultaneously provided to a top path and a bottom path. The top path includes a first constituent encoder 310, and the bottom path includes a selectable interleaver (π) 330 communicatively coupled to a second constituent encoder 320. A variety of interleaves may be performed as selected for the particular application within the selectable interleaver (π) 330. The selectable interleaver (π) 330 can include any number of interleaves, as shown by a first interleave (π1) 331, a second interleave (π2) 332, a third interleave (π3) 333, a fourth interleave (π4) 334, and up to an nth interleave (πn) 339. In some embodiments, only 4 interleaves are employed.

The outputs from the top (shown as T) and bottom (shown as B) paths are provided to a multiplexor (MUX) 340, whose selection is provided by a clock signal that is clocked at ½ the rate at which the input bits of the information block 301 are provided to the top and bottom paths. This way, the output of the MUX 340 alternatively selects the outputs from the top (shown as T) and bottom (shown as B) paths.

In some embodiment, these output encoded bits are then provided to a puncturing module 350. In certain embodiments, no puncturing is performed on the bits output from the MUX 340; they are all simply passed as output from the MUX 340. However, in other embodiments, puncturing is selectively performed to effectuate any number of criteria, including accommodating a particular code rate, a particular modulation type, among other considerations. A variety of encoded symbols 360 may then be then generated according to the outputs from the top and bottom paths; the bottom path being an interleaved path (i.e., as performed by one of the interleaves of the selectable interleaver (π) 330). It is noted that the selectable interleaver (π) 330 can also be implemented to change its operation as a function of time; for example, the selectable interleaver (π) 330 can employ the first interleave (π1) 331 during a first time or when encoding a first information block, and the selectable interleaver (π) 330 can employ the second interleave (π2) 332 during a second time, and so on.

These encoded symbols 360 of the encoded block may then be passed to a symbol mapper where the symbols are mapped according to the appropriate modulation (constellation and mapping).

It is noted that the selectable interleaver ($\pi$) 330 within the FIG. 2 may be implemented such that it operates to correspond the order of the input bits of the information block 301 with the order in which the encoded symbols 360 are output from this embodiment of turbo encoder. That is to say, the first output, encoded symbol corresponds to the first group of input bits (or first input symbol); the second output, encoded symbol corresponds to the second group of input bits (or second input symbol). Alternatively, the selectable interleaver ($\pi$) 330 may be implemented such that corresponding the order of the input bits (or symbols) need not necessarily correspond to the output order of the encoded symbols to the input order of the groups of input bits (or input symbols).

As with the previous embodiment, it is noted that the number of interleaves within the selectable interleaver ($\pi$) 330 can be any desired number, and in some embodiments, the number of interleaves within the selectable interleaver ($\pi$) 330 includes 10 or fewer interleaves. The turbo encoder 300 is operable to encode any information block whose size is within a predetermined range (e.g., between block size "a" and block size "b", where "a" and "b" are integer values and upper and lower bounds of the predetermined range, respectively. The predetermined range is divided into a plurality of regions such that each region of the plurality of regions (e.g., k regions) corresponds to one interleave of the plurality of interleaves. In other words, a first region employs a first interleave of the plurality of interleaves; a second region employs a second interleave of the plurality of interleaves. There is a one-to-one correspondence between each region and only one corresponding interleave of the plurality of interleaves.

Figure 4:
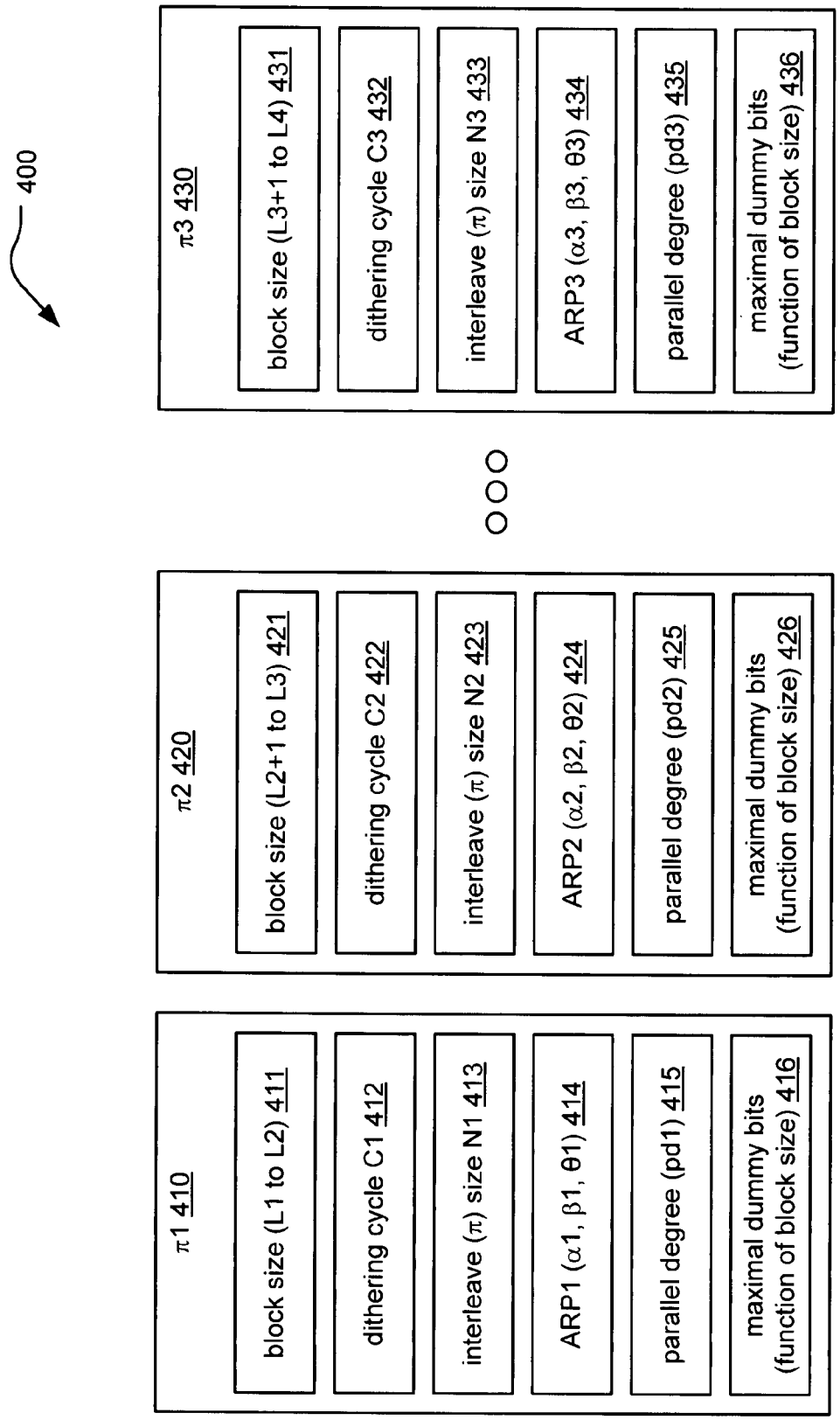
FIG. 4 illustrates an embodiment of many of the various parameters associated with various interleaves.

FIG. 4 illustrates an embodiment 400 of many of the various parameters associated with various interleaves. As shown above within various embodiments, a selectable interleaver ($\pi$) that is operable to employ any one of a plurality of interleaves ($\pi$1, $\pi$2, $\pi$3, etc.). Depending on the particular interleave ($\pi$) employed, various operational parameters of the turbo encoder are governed.

For example, depending on the information block size desired to be turbo encoded, an appropriate interleave ($\pi$) is selected and employed. In addition, based on the interleave ($\pi$) that is selected and employed, other operational parameters are then selected as well.

Looking at this embodiment 400, a first interleave ($\pi$1) 410 is operable to assist in the turbo encoding of block sizes from L1 to L2, as shown by reference numeral 411. A dithering cycle of C1, as shown by reference numeral 412, is also associated with the first interleave ($\pi$1) 410. The size of the first interleave ($\pi$1) is N1, as shown by reference numeral 413. The ARP itself that is employed for the first interleave ($\pi$1) 410 employs certain periodic function pairs ($\alpha$1, $\beta$1) and offset ($\theta$1), as shown by reference numeral 414. The first interleave ($\pi$1) 410 also provides a particular parallel degree (pd1) as shown by reference numeral 415. Also, the first interleave ($\pi$1) 410 will add, at most, a maximal number of dummy bits, as shown by reference numeral 416, which is a function of the information block size being turbo encoded. Each of a second interleave ($\pi$2) 420, a third interleave ($\pi$3) 430, and up to an nth interleave ($\pi$n) can also be associated with and govern similar operational parameters.

In one embodiment, a set of 4 base ARP interleaves are employed by a selectable interleaver ($\pi$) to enable turbo encoding of any possible block size from 40 to 8192 bits. In using these 4 base ARP interleaves ($\pi$), the value of P is chosen to be a fixed prime, i.e. 1021. In this way, the multiply P operation in the ARP interleaving becomes a mere scaling, which saves hardware area and power.

Only 4 different dithering cycles, C, and 4 different periodic function pairs ($\alpha(x)$, $\beta(x)$) are used. These are provided as follows:

1. Block size 40~$R_1$: C=2 and using ($\alpha_2(x)$, $\beta_2(x)$);
2. Block size $R_1$+1~$R_2$: C=4 and using ($\alpha_4(x)$, $\beta_4(x)$);
3. Block size $R_2$+1~$R_3$: C=8 and using ($\alpha_8(x)$, $\beta_8(x)$); and
4. Block size $R_3$+1~8192: C=10 and using ($\alpha_{10}(x)$, $\beta_{10}(x)$).

In one embodiment, the values of $R_1$=100, $R_2$=1500, and $R_3$=5000 are chosen. Other values may be employed based on design choice.

In general, given any information block (i.e., input bits arranged into an information block) of block size L, one can find its corresponding region among the set of 4 base ARP interleaves (i.e., interleave ($\pi$1), interleave ($\pi$2), interleave ($\pi$3), or interleave ($\pi$4)) and its dithering cycle C.

The ARP interleaves, the largest number of the dummy bits which may need to be added, and the possible parallel degrees are listed in the following table (where [ ] is the ceiling function, i.e., the ratio rounded up the nearest integer).

| Block size L | C | Interleave size N | ARP | Parallel degree | maximal dummy bits |
|---|---|---|---|---|---|
| 40~$R_1$ | 2 | 2 * [L/2] | {1021 * x + $\theta_2$ + 2 * [$\alpha_2$(x mod 2) * 1021 + $\beta_2$(x mod 2)]} mod N | 1, 2 (and 3, ..., 2v if 2v\|N, v > 1) | 1 |
| $R_1$ + 1~$R_2$ | 4 | 4 * [L/4] | {1021 * x + $\theta_4$ + 4 * [$\alpha_4$(x mod 4) * 1021 + $\beta_4$(x mod 4)]} mod N | 1, 2, 3, 4 (and 5, ..., 4v if 4v\|N, v > 1) | 3 |
| $R_2$ + 1~$R_3$ | 8 | 8 * [L/8] | {1021 * x + $\theta_8$ + 8 * [$\alpha_8$(x mod 8) * 1021 + $\beta_8$(x mod 8)]} mod N | 1, 2, 3, 4, 5, 6, 7, 8 (and 9, ..., 8v if 8v\|N, v > 1) | 7 |
| $R_3$ + 1~8192 | 10 | 10 * [L/10] | {1021 * x + $\theta_{10}$ + 10 * [$\alpha_{10}$(x mod 10) * 1021 + $\beta_{10}$(x mod 10)]} mod N | 1, 2, 3, 4, 5, 6, 7, 8, 9, 10 (and 11, ..., 10v if 10v\|N, v > 1) | 9 |

One embodiment of the interleave parameters (which can be modified or changed based on design choice) are given in the following table.

| L | C | θ | Interleave size N | $\alpha_C(0), \alpha_C(1), \ldots, \alpha_C(C-1)$, | $\beta_C(0), \beta_C(1), \ldots, \beta_C(C-1)$, |
|---|---|---|---|---|---|
| 40~100 | 2 | 0 | 2 * [L/2] | 1, 1 | 18, 17 |
| 101~1500 | 4 | 7 | 4 * [L/4] | 0, 1, 0, 1 | 246, 149, 210, 9 |
| 1501~5000 | 8 | 0 | 8 * [L/8] | 1, 1, 0, 1, 0, 0, 0, 0 | 327, 222, 159, 168, 54, 376, 204, 465 |
| 5000~8192 | 10 | 0 | 10 * [L/10] | 1, 1, 1, 0, 1, 0, 1, 0, 1, 0 | 360, 278, 127, 486, 322, 4, 325, 273, 288, 206 |

Figure 5:
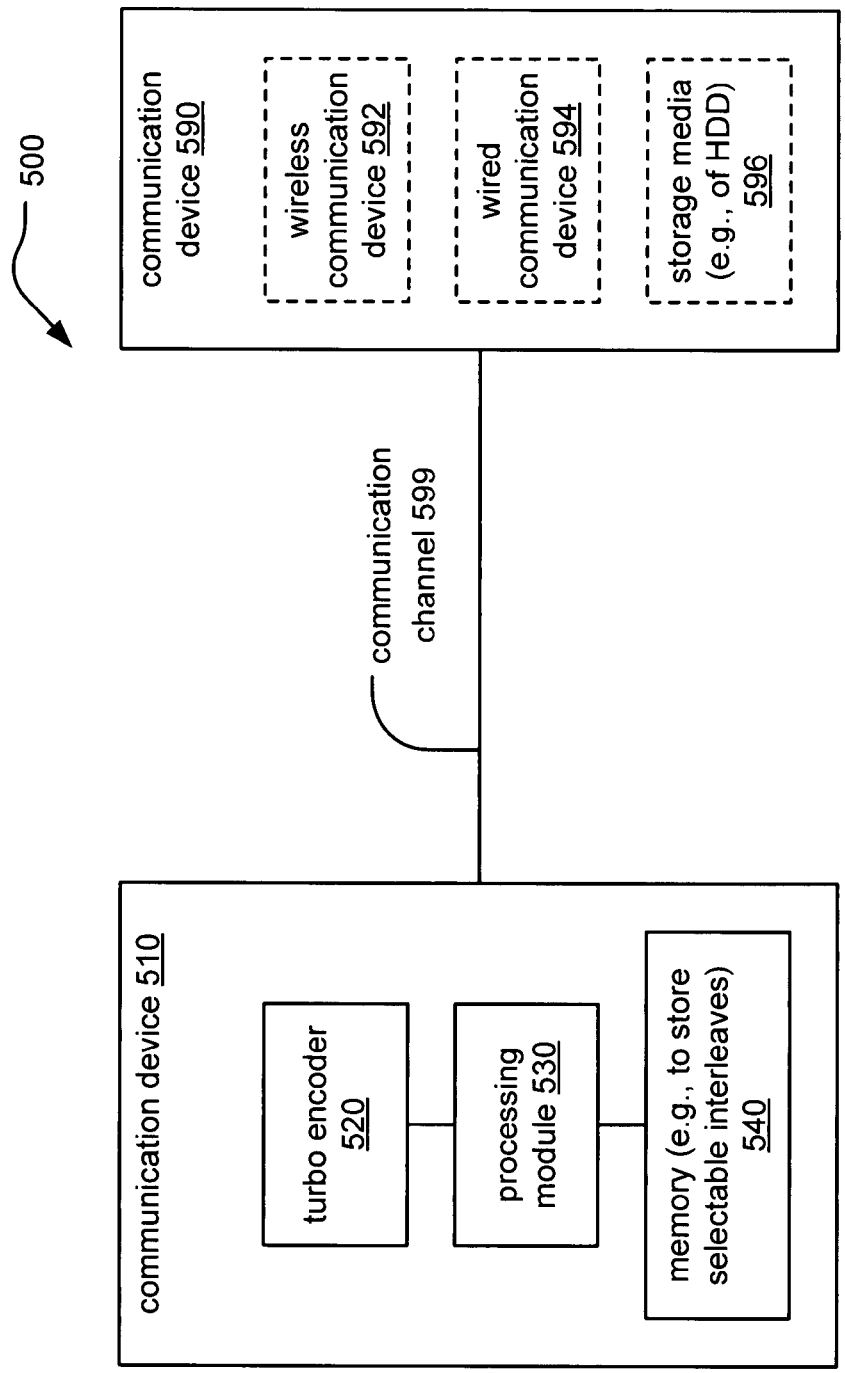
FIG. 5 and FIG. 6 illustrate other embodiments of a communication system.
Figure 6:
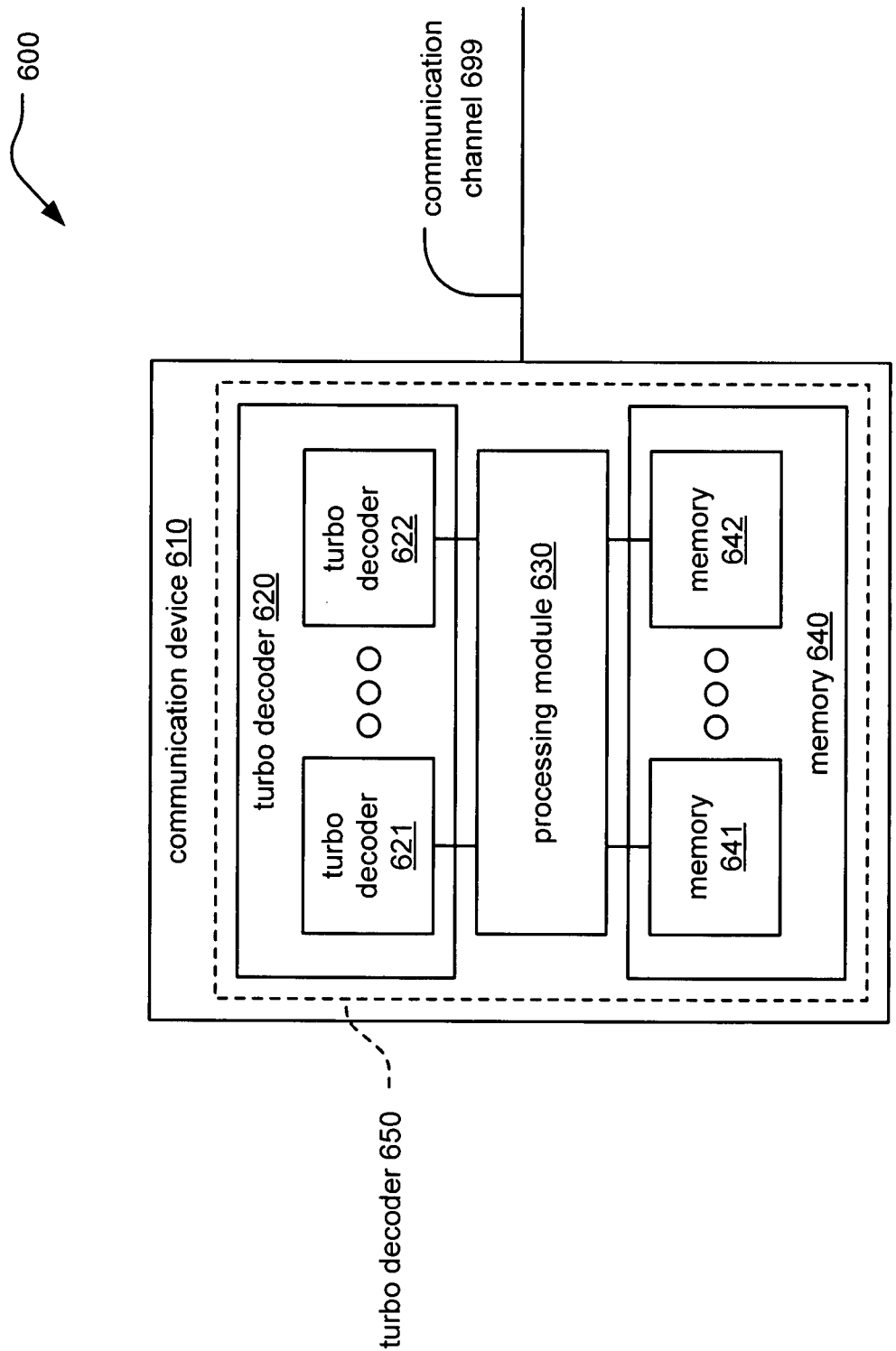

FIG. 5 and FIG. 6 illustrate other embodiments of a communication system.

Referring to the communication system 500 of FIG. 5, the communication system 500 includes a communication device 510 that is coupled to another device 590 via a communication channel 599. The communication device 510 includes an encoder 520 that includes a processing module 530 and a memory 540, module and/or device capable to store a plurality of interleaves, any one of which can be selected and employed by the turbo encoder 520 for us in performing turbo encoding.

The other communication device 590 to which the communication device 510 is coupled via the communication channel 599 can be a wireless communication device 592, wireless communication device 594, a storage media 594 (e.g., such as within the context of a hard disk drive (HDD)), or any other type of device that is capable to receive and/or transmit signals. In some embodiments, the communication channel 599 is a bi-directional communication channel that is operable to perform transmission of a first signal during a first time and receiving of a second signal during a second time. If desired, full duplex communication may also be employed, in which each of the communication device 510 and the device 590 can be transmitted and/or receiving from one another simultaneously.

The communication device 510 includes the turbo decoder 520, a processing module 530, and the memory 540. The processing module 530 can be coupled to the memory 540 so that the memory is operable to store operational instructions that enable to the processing module 530 to perform certain functions.

Generally speaking, the processing module 530 is operable to perform providing to and selection of an appropriate interleave for use by the turbo encoder 520 when encoding an information block.

It is also noted that the processing module 530 can be implemented strictly as circuitry. Alternatively, the processing module 530 can be implemented strictly in software such as can be employed within a digital signal processor (DSP) or similar type device. In even another embodiment, the processing module 530 can be implemented as a combination of hardware and software as well without departing from the scope and spirit of the invention.

In even other embodiments, the processing module 530 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The processing module 530 can be coupled to the memory 540 that is operable to store operational instructions that enable to processing module 530 to perform the appropriate contention-free memory mapping between the turbo decoder 520 and the memory 540.

Such a memory 540 may be a single memory device or a plurality of memory devices. Such a memory 540 may be a read-only memory, random access memory, volatile memory, non-volatile memory, static memory, dynamic memory, flash memory, and/or any device that stores digital information. Note that when the processing module 530 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Referring to the communication system 600 of FIG. 6, this embodiment is somewhat analogous to the previous embodiment. The communication system 600 includes a communication device 610 that can be coupled to another device via a communication channel 699. The communication device 610 includes a turbo decoder 620 that is itself composed of a plurality of turbo decoders 621-622. The communication device 610 also includes a memory 640 that is itself composed of a plurality of memories 641-642. A processing module 630 is operable to appropriate memory management during iterative decoding processing of a turbo coded signal that is received via the communication channel 699. In one embodiment, the processing module 630 is operable to perform contention-free memory mapping between the plurality of turbo decoders 621-622 and the plurality of memories 641-642 in some embodiments during iterative decoding processing of a turbo coded signal that is received via the communication channel 699.

Figure 7:
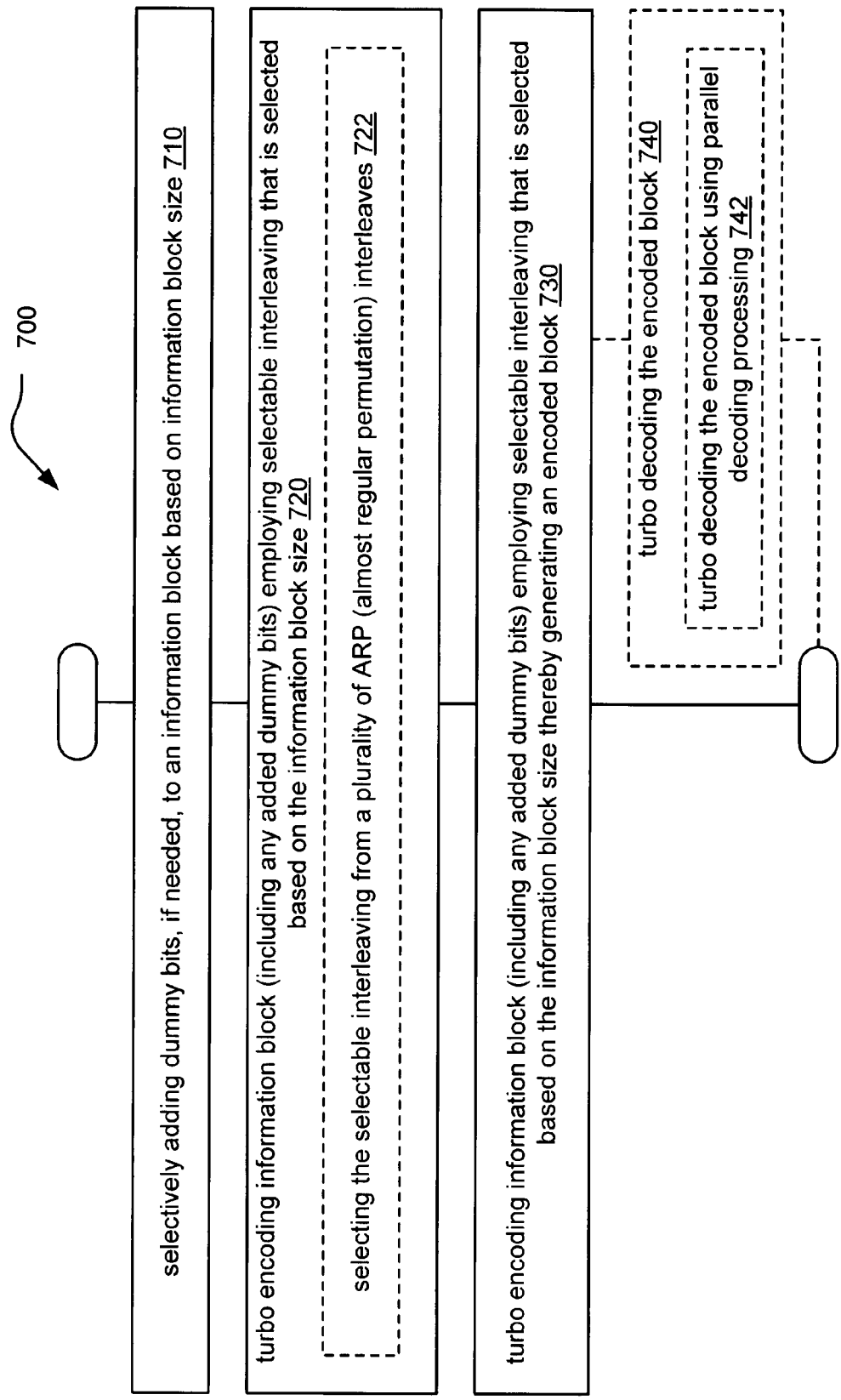
FIG. 7 illustrates an embodiment of a turbo encoding method that employs selectable interleaving.

FIG. 7 illustrates an embodiment of a turbo encoding method 700 that employs selectable interleaving. As shown in a block 710, the method 700 involves selectively adding dummy bits, if needed, to an information block based on information block size. Then, as shown in a block 720, the method 700 involves turbo encoding information block (including any added dummy bits) employing selectable interleaving that is selected based on the information block size. If desired in some embodiments, the method 700 involves selecting the selectable interleaving from a plurality of ARP (almost regular permutation) interleaves, as shown in a block 722.

The method continues, as shown in a block 730, by performing turbo encoding information block (including any added dummy bits) employing selectable interleaving that is selected based on the information block size thereby generating an encoded block.

In some embodiments, the method 700 can also include turbo decoding the encoded block, as shown in a block 740.

This turbo decoding can be performed using parallel decoding processing, as shown in a block 742 if desired.

FIG. 8, FIG. 9, FIG. 10, and FIG. 11 illustrate performance diagrams of 7 different block sized turbo codes as simulated with Rel.6 interleaves and the novel ARP interleaves provided herein. The code rate is ⅓ and the communication channel is an Additive White Gaussian Noise (AWGN) communication channel.

Referring to diagram 800 of FIG. 8, performance of a turbo code employing a block size L=99 and a proposed, novel ARP having a dithering cycle C=2 is compared to performance of a turbo code employing a block size L=99 according the conventions of Rel.6. Also, performance of a turbo code employing a block size L=52 and a proposed, novel ARP having a dithering cycle C=2 is compared to performance of a turbo code employing a block size L=52 according the conventions of Rel.6.

Referring to diagram 900 of FIG. 9, performance of a turbo code employing a block size L=902 and a proposed, novel ARP having a dithering cycle C=4 is compared to performance of a turbo code employing a block size L=902 according the conventions of Rel.6. Also, performance of a turbo code employing a block size L=319 and a proposed, novel ARP having a dithering cycle C=4 is compared to performance of a turbo code employing a block size L=319 according the conventions of Rel.6.

Referring to diagram 1000 of FIG. 10, performance of a turbo code employing a block size L=3760 and a proposed, novel ARP having a dithering cycle C=8 is compared to performance of a turbo code employing a block size L=3760 according the conventions of Rel.6. Also, performance of a turbo code employing a block size L=1965 and a proposed, novel ARP having a dithering cycle C=8 is compared to performance of a turbo code employing a block size L=1965 according the conventions of Rel.6.

Figure 11:
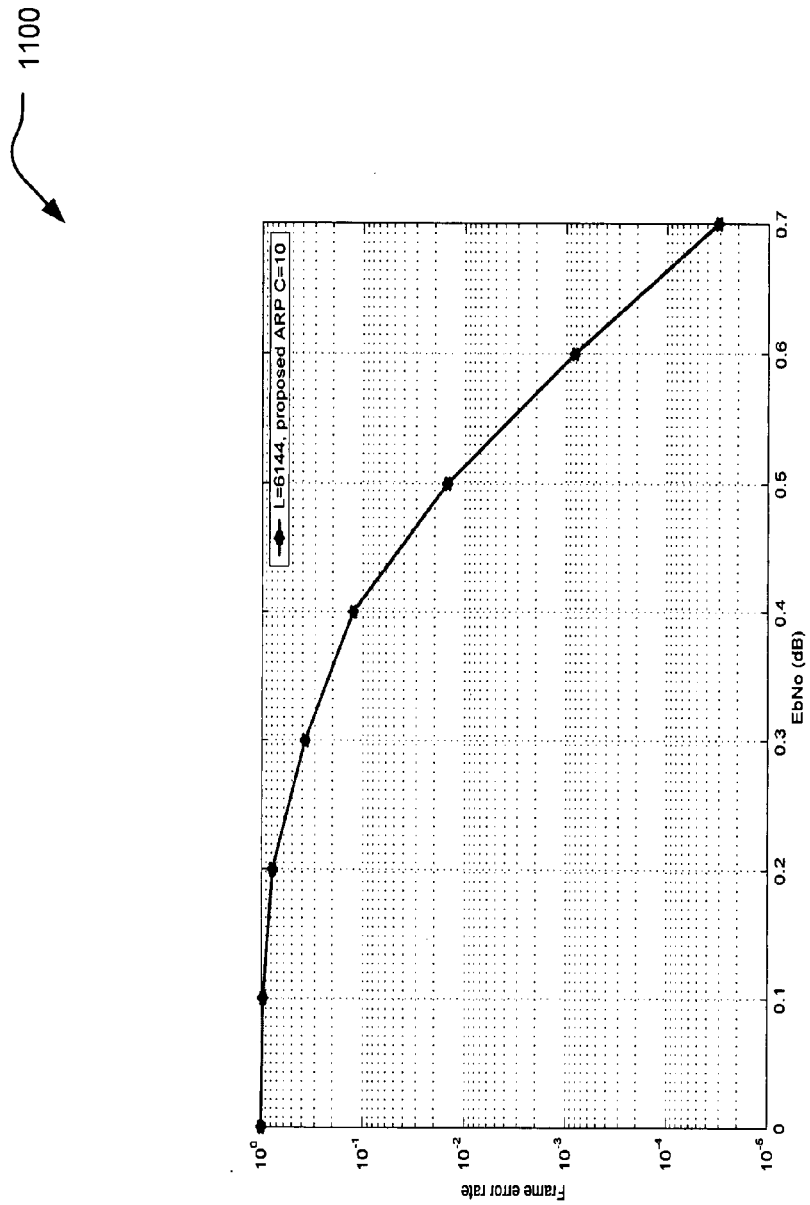

Referring to diagram 1100 of FIG. 11, performance of a turbo code employing a block size L=6144 and a proposed, novel ARP having a dithering cycle C=10 is shown.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] C. Berrou, Y. Saouter, C. Douillard, S. Kerouédan, and M. Jézéquel, "Designing good permutations for turbo codes: towards a single model," 2004 *IEEE International Conference on Communications* (*ICC*), Vol.: 1, pp: 341-345, 20-24 Jun. 2004.

[2] 3GPP TS 25.212 V6.8.0 (2006-06).

[3] Proposed way forward on turbo interleaver (tc_info_sizes_test_mot_nov14.txt), 3GPP TSG RAN WG1 #47 R1-063564.

What is claimed is:

1. A turbo encoder having selectable ARP (almost regular permutation) interleaving, the turbo encoder comprising:
   a first constituent encoder for encoding an information block thereby generating a first encoded plurality of bits;
   a selectable ARP interleaver for employing one selected ARP interleave of a plurality of ARP interleaves to interleave the information block, wherein the one selected ARP interleave selected based on a size of the information block; and
   a second constituent encoder for encoding the interleaved information block thereby generating a second encoded plurality of bits;
   and wherein:
   bits alternatively selected from the first encoded plurality of bits and the second encoded plurality of bits forming an encoded block;
   the plurality of ARP interleaves including 10 or fewer ARP interleaves;
   the turbo encoder for encoding any information block whose size being within a predetermined range having a first information block size as a lower bound of the predetermined range and a second information block size as an upper bound of the predetermined range; and
   the predetermined range divided into a plurality of regions such that each region of the plurality of regions corresponding to one ARP interleave of the plurality of ARP interleaves and also corresponding to one group of information block sizes of a plurality of groups of information block sizes.

2. The turbo encoder of claim 1, wherein:
   the selectable ARP interleaver is operable for generating the one selected ARP interleave of the plurality of ARP interleaves in real time using a closed formula solution.

3. The turbo encoder of claim 1, wherein:
   the plurality of interleaves including no more than 4 interleaves; and
   the information block including any number of bits between 40 and 8192, inclusive.

4. The turbo encoder of claim 1, further comprising:
   a dummy bit module for selectively modifying the information block by adding a dummy bit to the information block based on the size of the information block.

5. The turbo encoder of claim 1, further comprising:
a dummy bit module for selectively modifying the information block by adding a dummy bit to the information block based on the size of the information block; and wherein:
a number of dummy bits added to the information block being one less than a dithering cycle of the one selected ARP interleave of the plurality of ARP interleaves.

6. The turbo encoder of claim 1, wherein:
each ARP interleave of the plurality of ARP interleaves generated using a same scalar coefficient, P, that is relative prime to the information block, L, such that ARP interleave is defined as follows:

$$i=\pi(j)=jP+\theta+A(j\bmod C)P+B(j\bmod C)\bmod L;$$

θ is a constant value;
A(x) and B(x) are integer function defined on {0,1,Λ,C−1}; and
C is a divider of L.

7. The turbo encoder of claim 1, further comprising:
a turbo decoder, including a plurality of parallel arranged turbo decoders, for decoding the encoded block; and wherein:
based on the size of the information block, the turbo decoder for employing a selected number of turbo decoders from the plurality of parallel arranged turbo decoders to decode the encoded block.

8. The turbo encoder of claim 1, further comprising:
a turbo decoder, including a plurality of parallel arranged turbo decoders, for decoding the encoded block; and wherein:
when the information block including any number of bits between 40 and 100, inclusive, the turbo decoder for employing no more than 2 turbo decoders from the plurality of parallel arranged turbo decoders to decode the encoded block;
when the information block including any number of bits between 101 and 1500, inclusive, the turbo decoder for employing no more than 4 turbo decoders from the plurality of parallel arranged turbo decoders to decode the encoded block;
when the information block including any number of bits between 1501 and 5000, inclusive, the turbo decoder for employing no more than 8 turbo decoders from the plurality of parallel arranged turbo decoders to decode the encoded block; and
when the information block including any number of bits between 5001 and 8192, inclusive, the turbo decoder for employing no more than 10 turbo decoders from the plurality of parallel arranged turbo decoders to decode the encoded block.

9. The turbo encoder of claim 1, wherein:
the turbo encoder is implemented within a wireless personal communication device.

10. The turbo encoder of claim 1, wherein:
the turbo encoder is implemented within a communication device; and
the communication device is implemented within a wireless communication system.

11. A turbo encoder having selectable ARP (almost regular permutation) interleaving, the turbo encoder comprising:
a dummy bit module for selectively modifying an information block by adding a dummy bit to the information block based on the size of the information block thereby generating a modified information block;
a first constituent encoder for encoding the modified information block thereby generating a first encoded plurality of bits;
a selectable ARP interleaver for:
selecting one ARP interleave from a plurality of ARP interleaves based on a size of the information block;
generating the one selected ARP interleave of the plurality of ARP interleaves in real time using a closed formula solution; and
employing the one selected ARP interleave of a plurality of ARP interleaves to interleave the modified information block; and
a second constituent encoder for encoding the interleaved, modified information block thereby generating a second encoded plurality of bits; and wherein:
bits alternatively selected from the first encoded plurality of bits and the second encoded plurality of bits forming an encoded block;
the plurality of ARP interleaves including 10 or fewer ARP interleaves;
the turbo encoder for encoding any information block whose size being within a predetermined range having a first information block size as a lower bound of the predetermined range and a second information block size as an upper bound of the predetermined range; and
the predetermined range divided into a plurality of regions such that each region of the plurality of regions corresponding to one ARP interleave of the plurality of ARP interleaves and also corresponding to one group of information block sizes of a plurality of groups of information block sizes.

12. The turbo encoder of claim 11, wherein:
a number of dummy bits added to the information block being one less than a dithering cycle of the one selected ARP interleave of the plurality of ARP interleaves.

13. The turbo encoder of claim 11, wherein:
each ARP interleave of the plurality of ARP interleaves generated using a same scalar coefficient, P, that is relative prime to the information block, L, such that ARP interleave is defined as follows:

$$i=\pi(j)=jP+\theta+A(j\bmod C)P+B(j\bmod C)\bmod L;$$

θ is a constant value;
A(x) and B(x) are integer function defined on {0,1,Λ,C−1} ; and
C is a divider of L.

14. The turbo encoder of claim 11, wherein:
the information block including 8192 or fewer bits; and
no more than 9 dummy bits added to the information block.

15. The turbo encoder of claim 11, further comprising:
a turbo decoder, including a plurality of parallel arranged turbo decoders, for decoding the encoded block; and wherein:
based on the size of the information block, the turbo decoder for employing a selected number of turbo decoders from the plurality of parallel arranged turbo decoders to decode the encoded block.

16. The turbo encoder of claim 11, further comprising:
a turbo decoder, including a plurality of parallel arranged turbo decoders, for decoding the encoded block; and wherein:
when the information block including any number of bits between 40 and 100, inclusive, the turbo decoder for employing no more than 2 turbo decoders from the plurality of parallel arranged turbo decoders to decode the encoded block;

when the information block including any number of bits between 101 and 1500, inclusive, the turbo decoder for employing no more than 4 turbo decoders from the plurality of parallel arranged turbo decoders to decode the encoded block;

when the information block including any number of bits between 1501 and 5000, inclusive, the turbo decoder for employing no more than 8 turbo decoders from the plurality of parallel arranged turbo decoders to decode the encoded block; and when the information block including any number of bits between 5001 and 8192, inclusive, the turbo decoder for employing no more than 10 turbo decoders from the plurality of parallel arranged turbo decoders to decode the encoded block.

17. The turbo encoder of claim 11, wherein:

the turbo encoder is implemented within a communication device; and the communication device is implemented within a wireless communication system.

18. A method for turbo encoding at least one information bit using selectable ARP (almost regular permutation) interleaving, the method comprising:

selectively modifying an information block by adding a dummy bit to the information block based on the size of the information block thereby generating a modified information block;

employing a first constituent encoder for encoding the modified information block thereby generating a first encoded plurality of bits;

selecting one ARP interleave of a plurality of ARP interleaves based on a size of the information block, wherein the plurality of ARP interleaves including 10 or fewer ARP interleaves;

interleaving the modified information block using the one selected ARP interleave of the plurality of ARP interleaves;

employing a second constituent encoder for encoding the interleaved, modified information block thereby generating a second encoded plurality of bits; and alternatively selecting bits from the first encoded plurality of bits and the second encoded plurality of bits thereby forming an encoded block; and wherein:

the method for encoding any information block whose size being within a predetermined range having a first information block size as a lower bound of the predetermined range and a second information block size as an upper bound of the predetermined range; and the predetermined range divided into a plurality of regions such that each region of the plurality of regions corresponding to one ARP interleave of the plurality of ARP interleaves and also corresponding to one group of information block sizes of a plurality of groups of information block sizes.

19. The method of claim 18, further comprising:

modifying the encoded block to a form comporting with a communication channel of the wireless communication system; and after the turbo coded block has undergone modification, launching the modified encoded block into the communication channel from the communication device.

20. The method of claim 18, wherein:

the method performed within a turbo encoder of a communication device operative within a wireless communication system;

the communication device for modifying the encoded block to a form comporting with a communication channel of the wireless communication system; and after undergoing modification, the communication device launching the modified encoded block into the communication channel.

* * * * *